United States Patent
Swoboda

(10) Patent No.: US 8,984,319 B2
(45) Date of Patent: Mar. 17, 2015

(54) ADAPTER POWER UP CIRCUITRY FORCING TAP STATES AND DECOUPLING TAP

(71) Applicant: Texas Instruments Incorporated, Dallas, TX (US)

(72) Inventor: Gary L. Swoboda, Sugar Land, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 14/075,092

(22) Filed: Nov. 8, 2013

(65) Prior Publication Data

US 2014/0068361 A1 Mar. 6, 2014

Related U.S. Application Data

(62) Division of application No. 13/226,058, filed on Sep. 6, 2011, now Pat. No. 8,607,088, which is a division of application No. 12/134,779, filed on Jun. 6, 2008, now Pat. No. 8,037,355.

(60) Provisional application No. 60/933,645, filed on Jun. 7, 2007, provisional application No. 60/937,388, filed on Jun. 27, 2007.

(51) Int. Cl.
*G06F 1/04* (2006.01)
*G01R 31/317* (2006.01)
*G06F 11/267* (2006.01)
(Continued)

(52) U.S. Cl.
CPC ............ *G01R 31/317* (2013.01); *G06F 11/267* (2013.01); *G06F 1/12* (2013.01); *H04L 7/046* (2013.01)

USPC ............ 713/375; 710/105; 710/110; 714/30; 714/727

(58) Field of Classification Search
CPC ................. G01R 31/31705; G01R 31/318544; G01R 31/3177; G01R 31/318533; G01R 31/318536; G01R 31/318558; G06F 11/3656
USPC ........... 713/375; 714/30, 40, 727; 710/60, 64, 710/105, 110, 301, 302, 313
See application file for complete search history.

(56) References Cited

U.S. PATENT DOCUMENTS 4,733,353 A * 3/1988 Jaswa ........................... 713/375
5,048,021 A * 9/1991 Jarwala et al. ................. 714/727
(Continued)

OTHER PUBLICATIONS

IEEE. IEEE Standard Test Access Port and Boundary-Scan Architecture. Jun. 14, 2001.*
(Continued)

*Primary Examiner* — Matthew David
(74) *Attorney, Agent, or Firm* — Lawrence J. Bassuk; Frederick J. Telecky, Jr.

(57) ABSTRACT

A method comprises a system comprising a host device coupled to a first remote device actively operating according to a state diagram that the host device and all remote devices follow during operation of the system. The method further comprises powering up a second remote device while the host device and first remote device are actively operating according to the state diagram. The second remote device determines whether to initialize to a standard protocol or to an advanced protocol. Upon determining to initialize to the advanced protocol, the second remote device then waits for a synchronization point sequence.

4 Claims, 8 Drawing Sheets

(51) Int. Cl.
*G06F 1/12* (2006.01)
*H04L 7/04* (2006.01)

(56) References Cited

U.S. PATENT DOCUMENTS

| | | | | |
|---|---|---|---|---|
| 5,132,635 | A * | 7/1992 | Kennedy | 324/756.05 |
| 5,325,368 | A * | 6/1994 | James et al. | 714/727 |
| 5,483,518 | A * | 1/1996 | Whetsel | 370/241 |
| 5,640,514 | A * | 6/1997 | Barthel et al. | 709/248 |
| 5,841,867 | A * | 11/1998 | Jacobson et al. | 713/187 |
| 5,852,617 | A * | 12/1998 | Mote, Jr. | 714/726 |
| 5,862,152 | A * | 1/1999 | Handly et al. | 714/727 |
| 6,185,642 | B1 * | 2/2001 | Beukema et al. | 710/60 |
| 6,425,101 | B1 * | 7/2002 | Garreau | 714/727 |
| 6,522,985 | B1 * | 2/2003 | Swoboda et al. | 702/117 |
| 6,684,292 | B2 * | 1/2004 | Piccirillo et al. | 711/106 |
| 6,912,606 | B2 * | 6/2005 | Fay | 710/64 |
| 6,912,675 | B2 * | 6/2005 | Swoboda | 714/45 |
| 6,985,848 | B2 * | 1/2006 | Swoboda et al. | 703/26 |
| 7,036,064 | B1 * | 4/2006 | Kebichi et al. | 714/744 |
| 7,043,418 | B2 * | 5/2006 | Swoboda et al. | 703/28 |
| 7,076,419 | B2 * | 7/2006 | Swoboda | 703/24 |
| 7,206,734 | B2 * | 4/2007 | Swoboda | 703/26 |
| 7,315,808 | B2 * | 1/2008 | Swoboda et al. | 703/28 |
| 7,318,017 | B2 * | 1/2008 | Swoboda | 703/28 |
| 7,404,128 | B2 * | 7/2008 | Whetsel | 714/727 |
| 7,552,360 | B2 * | 6/2009 | Swoboda | 714/30 |
| 7,757,029 | B2 * | 7/2010 | Bonnet | 710/301 |
| 7,783,925 | B2 * | 8/2010 | Swoboda | 714/30 |
| 7,793,152 | B2 * | 9/2010 | Swoboda | 714/30 |
| 2005/0204225 | A1 * | 9/2005 | Whetsel | 714/726 |
| 2006/0095592 | A1 * | 5/2006 | Borkenhagen | 710/2 |
| 2008/0307214 | A1 * | 12/2008 | Swoboda | 713/1 |
| 2008/0307279 | A1 * | 12/2008 | Swoboda | 714/727 |
| 2010/0031089 | A1 * | 2/2010 | Swoboda | 714/30 |
| 2010/0031100 | A1 * | 2/2010 | Swoboda | 714/726 |
| 2010/0031103 | A1 * | 2/2010 | Swoboda | 714/731 |
| 2010/0031104 | A1 * | 2/2010 | Swoboda | 714/731 |

OTHER PUBLICATIONS

Sun Microelectronics. Introduction to JTAG Boundary Scan. White Paper. Jan. 1997.*
IEEE. IEEE Standard for a Mixed-Signal Test Bus. Jun. 26, 1999.*
Texas Instruments. IEEE Std 11.49.1 (JTAG) Testability. Primer. 1997.*

* cited by examiner

US 8,984,319 B2

ADAPTER POWER UP CIRCUITRY FORCING TAP STATES AND DECOUPLING TAP

RELATED APPLICATIONS

This application is a divisional of prior application Ser. No. 13/226,058, filed Sep. 6, 2011, now U.S. Pat. No. 8,607,088, issued Dec. 10, 2013;

Which was a divisional of application Ser. No. 12/134,779, filed Jun. 6, 2008, now U.S. Pat. No. 8,037,355, granted Oct. 11, 2011;

Which claims priority to and incorporates by reference U.S. Provisional Patent Application No. 60/933,645, filed Jun. 7, 2007;

And also claims priority to U.S. Provisional Patent Application No. 60/937,388, filed Jun. 27, 2007, both of which are incorporated herein by reference in their entirety.

BACKGROUND

Many electronic systems permit various components to communicate via a shared bus. For example, JTAG-enabled ("Joint Test Action Group," IEEE standard number 1149.1) devices in a system can be configured to communicate in a "star" configuration in which the various devices share the standard JTAG signals: test data input (TDI), test data output (TDO), etc. Some systems (e.g., JTAG-enabled systems) operate in accordance with a system-wide state diagram whereby all constituent devices follow a common state diagram in concert. Moreover, the interpretation of the various bits on the common bus is a function of the particular state of the system. If a device is unaware of the state of the system, that device may not, and likely will not, be able to correctly interpret the bits on the signal lines.

JTAG systems, particularly star configurations, traditionally have not permitted the hot disconnecting and hot connecting of devices while a scan chain is being performed. However, many devices have various power states and can be powered on and off while the rest of the system is operating. Such power state manipulation of individual devices conserves power, but is not readily accommodated by the JTAG standard. If a device were to power up in a JTAG-enabled system that is otherwise already operational, the newly powered device would not know the current state of the system and thus not be able to participate in the communications and testing activity.

SUMMARY

In accordance with one embodiment, a method comprises a system comprising a host device coupled to a first remote device actively operating according to a state diagram that the host device and all remote devices follow during operation of the system. The method further comprises powering up a second remote device while the host device and first remote device are actively operating according to the state diagram. The second remote device determines whether to initialize to a standard protocol or to an advanced protocol. Upon determining to initialize to the advanced protocol, the second remote device then waits for a synchronization point sequence.

In accordance with another embodiment, a device comprises an adapter that contains a first test access port (TAP) controller and scan test logic (STL) coupled to the adapter. The scan test logic contains a second TAP controller. Upon powering up, the first TAP controller transitions to an idle state, causes the STL to be decoupled, and monitors a system for a synchronization point sequence. The system comprises a debug test system (DTS) coupled to and, while the device is powering up, actively communicates with at least one target system (TS) in accordance with a system-wide state diagram.

In yet another embodiment, a system comprises a debug test system (DTS) that coordinates testing activities, a first target system (TS) coupled to the DTS via a shared bus and tested by the DTS, and a second TS coupled to the DTS via the shared bus. The DTS provides a synchronization point sequence on the shared bus that causes the first and second TS's to implement a predetermined feature set. The second TS detects the synchronization point sequence after powering on and while in an idle state waiting for the synchronization point sequence. The system operates according to a system state diagram in which the DTS and all TS's follow the same states at the same time.

BRIEF DESCRIPTION OF THE DRAWINGS

For a detailed description of exemplary embodiments of the invention, reference will now be made to the accompanying drawings in which.

NOTATION AND NOMENCLATURE

Certain terms are used throughout the following description and claims to refer to particular system components. As one skilled in the art will appreciate, companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . . " Also, the term "couple" or "couples" is intended to mean either an indirect or direct electrical connection. Thus, if a first device couples to a second device, that connection may be through a direct electrical connection, or through an indirect electrical connection via other devices and connections.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

Figure 1A:
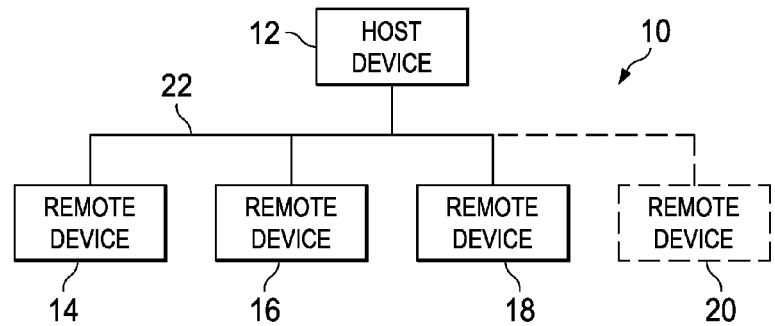
FIG. 1a shows a system in accordance with various embodiments.

FIG. 1a is directed to a system 10 comprising a host device 12 communicatively coupled to remote devices 14, 16, 18, and 20 via a shared bus 22. Remote devices 14-18 are powered on and operational, while remote device 20 is not powered on and operational (denoted in FIG. 1a in dashed line). In some embodiments, the remote device 20 has core logic that is powered off and input/output (I/O) logic that is powered on and capable of monitoring activity on the shared bus 22.

The system 10 preferably operates in accordance with a system-wide state diagram. The host device 12 and remote devices 14-16 are all in the same state at the same time. The encoding of the bits on the shared bus 22 is dependent, at least in part, on the state of the system 10. As all of the devices (host device 12 and remote devices 14-16) follow the same state diagram and thus are all at the same state. Correct interpretation of the bits on the shared bus 22 depends on the state of the system. All of the devices can readily communicate with one another according to the applicable protocol. One such protocol is the JTAG protocol.

Figure 1B:
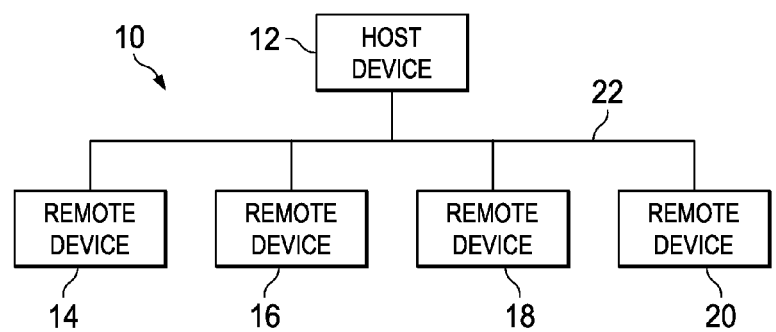
FIG. 1b shows the system in which a newly powered-on device is shown.

FIG. 1b shows the system 10 of FIG. 1a, but with previously powered off remote device 20 now powered on (denoted in FIG. 1b in sold line). Remote device 20 powers on while the rest of the system is already powered on and operational. The newly powered on remote device 20 does not initially know the state in which the system 10 is currently operating. In accordance with the preferred embodiments, the newly powered on remote device 20 initializes to an idle state in which device 20 does not actively drive any of the signals on the shared bus 22. Instead, the device 20 monitors the bit pattern on the shared bus 22 for a "synchronization point sequence" from which the device 20 can determine the state of the system.

A synchronization point sequence is a bit pattern that would normally not occur on the shared bus (other than to re-synchronize a system that may have a newly powered on device) and is generated by the host device 12 to cause any recently powered on remote devices (e.g., remote device 20) to be informed of, or otherwise determine, the state of the system. All of the remote devices detect the presence of the synchronization point sequence which causes all remote devices, including any newly powered on device, to implement a common predetermined feature set that is implementable by all such devices. Such a feature set is also referred to as the "lowest common denominator" operation in that all TS's are guaranteed to be able to implement the feature set. At that point, the newly powered on remote device 20 can begin to operate in concert with the rest of the system and be synchronized to the same state as the rest of the system.

Figure 2:
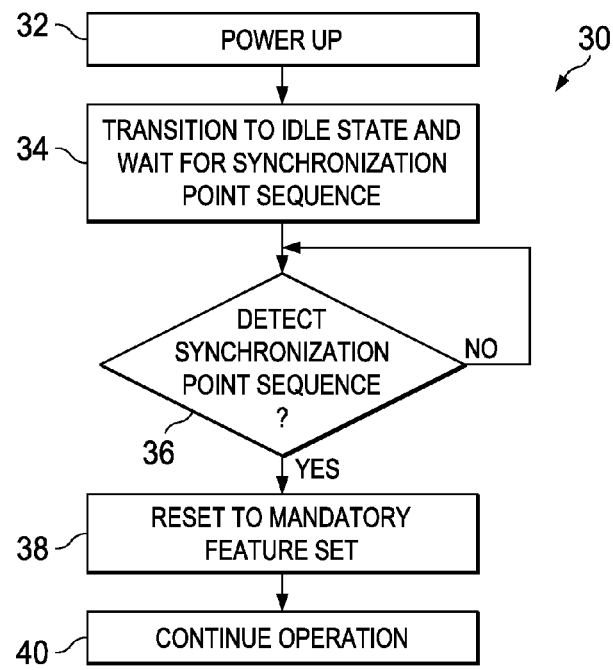
FIG. 2 shows a method usable in accordance with various embodiments.

FIG. 2 shows a method 30 that is implemented on the system 10. At 32, the remote device 20 is powered up (e.g., the power state of the device changes from a low power mode to a higher power mode as a result of a predetermined event). At 34, the remote device 20 transitions to an idle state and waits for a synchronization point sequence. At 36, the remote device 20 monitors the system 10, and in particular the shared bus 22, for the synchronization point sequence. If the synchronization point sequence is not detected, the remote device 20 continues to monitor the shared bus 22 for the sequence. Once the synchronization point sequence is detected, then at 38, the remote device 20 as well as all other remote devices 14-18 in the system 10 reset to a mandatory feature set. At 40, the newly powered on device 22 continues operation with the rest of the system 10 and in accordance with the system state diagram. All other remote devices in the system also detect the synchronization point sequence. While such devices already know the state of the system, such devices nonetheless implement the same mandatory feature set and transition to the same state as the newly powered device 20 so that the entire system is again working in concert with the state diagram.

In accordance at least some embodiments, the system 10 is JTAG-enabled. As such, the host device 12 implements test scan chain sequences to test the remote devices 14-20. The shared bus 22 in such embodiments is a JTAG communication link and the system is configured in a star configuration. The signals comprising the shared bus 22 are the JTAG TDI, TDO, TCK and TMS signals.

Figure 3:
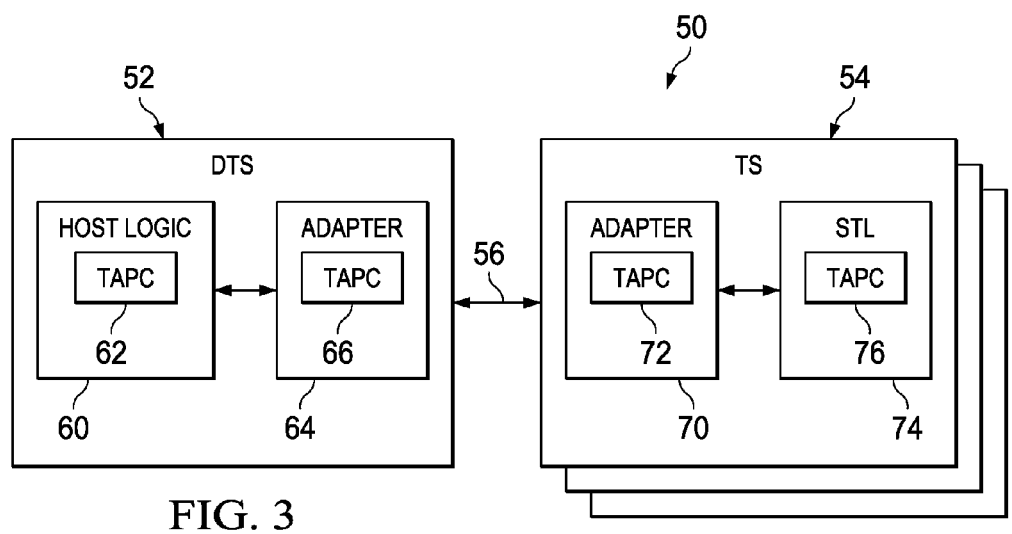
FIG. 3 shows a JTAG-enabled system in accordance with various embodiments.

FIG. 3 illustrates an embodiment of a JTAG-enabled system 50 comprising a debug test system (DTS) 52 coupled via a JTAG communication link 56 to one or more target systems (TS's) 54 in a star configuration. Although three TS's 54 are shown, any number are possible. In system 50, the DTS 52 includes an adapter 64 containing an IEEE 1149.1 TAP controller (TAPC) 66 and host logic 60 which may also include a TAP controller 62. The TS 54 also includes an adapter 70 coupled to system test logic (STL) 74. Each of the TS's adapter 70 and STL 74 includes a TAPC 72 and 74, respectively. The adapter 70 of the TS 54 enables the selection of standard mode and an advanced mode in various ways. U.S. Pat. Pub. 20060279439 describes this architecture in further detail and is incorporated herein by reference.

Figure 4:
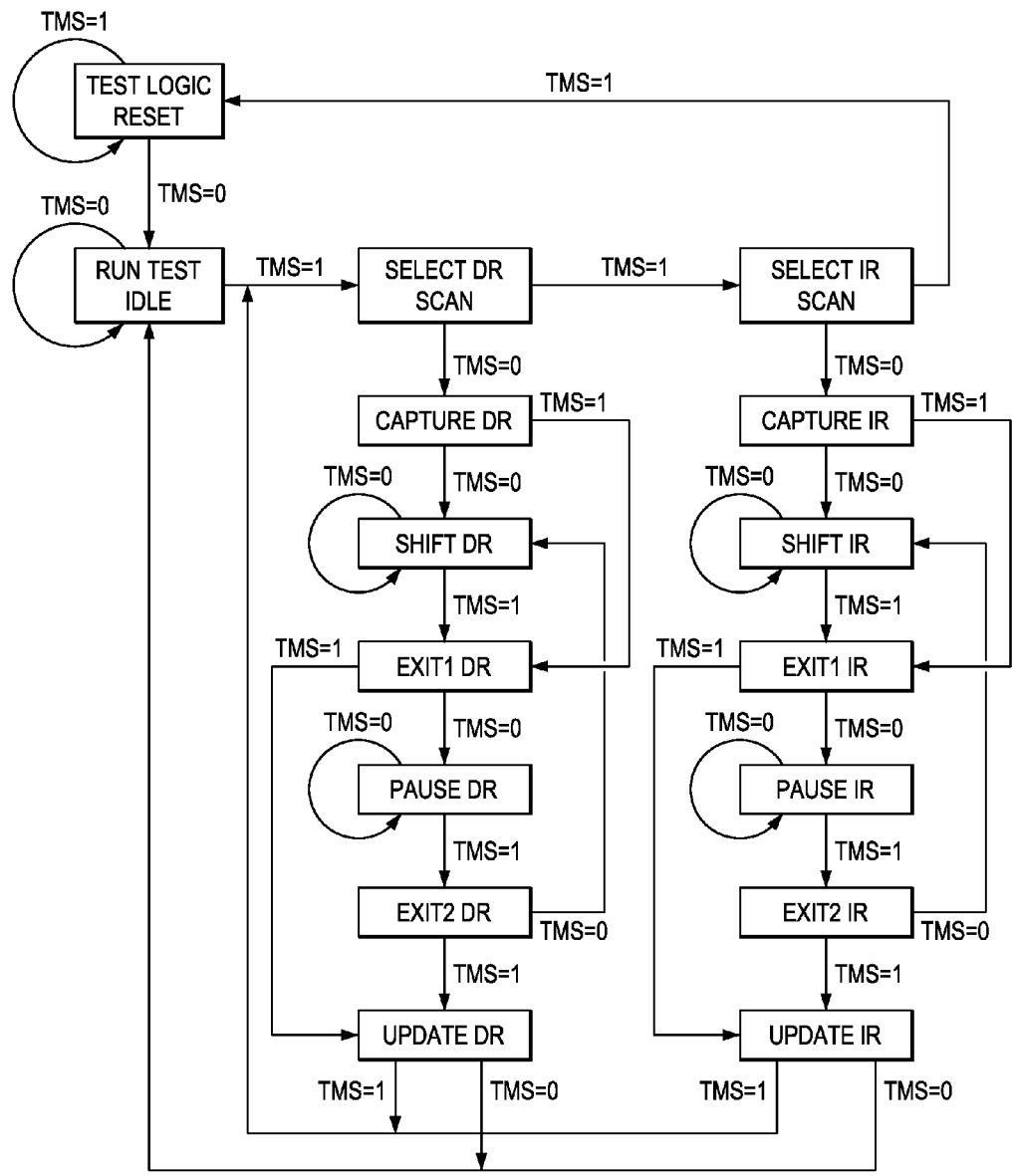
FIG. 4 shows a state diagram usable with the JTAG-enabled system of FIG. 3.

FIG. 4 shows an illustrative system-wide JTAG state diagram implemented on system 50. The illustrative state diagram shown in FIG. 4 is in accordance with the JTAG IEEE 1149 standard. From the test logic reset state, a TAP controller may enter the run test idle state depending on the TMS bit. From run test idle, the TAP controller may perform a data register (DR) scan or an instruction register (IR) scan. Each of the DR and IR scans generally involves the TAP controller performing a capture, shift, and update as illustrated. Various pause or exit states are built into the state diagram. Following the update, the TAP controller may return to the run test idle state or perform another DR or IR scan.

Figure 5:
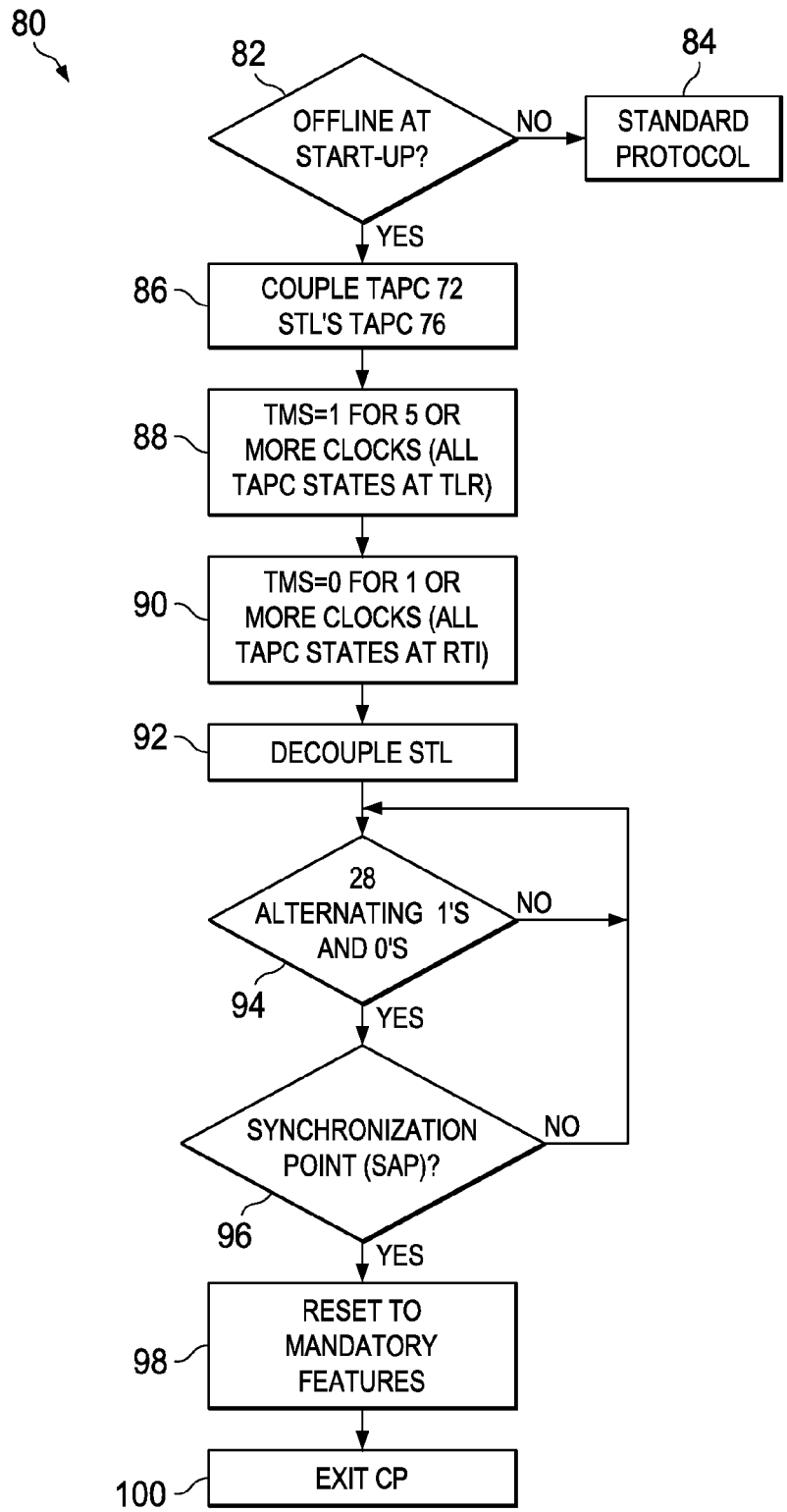
FIG. 5 shows a method usable in accordance with the JTAG-enabled system of FIG. 3.

FIG. 5 illustrates a method 80 that is implemented on the JTAG-enabled system 50 of FIG. 3. More specifically, method 80 is performed by a TS 54 that powers up in accordance with a preferred embodiment of the invention. The newly powered up TS 54 will not know the state of the system (i.e., in which state in the state diagram of FIG. 4 the system is operating). At 82, the TS 54 determines whether the device is to initialize into the "offline at start-up" mode or into a standard JTAG protocol. This determination may be hardwired into the TS (e.g., pins or jumpers that are preset) or in accordance with other techniques (e.g., a programmable register). If the standard JTAG protocol has been selected then, at 84 the TS initializes into the standard JTAG protocol.

If, however, the TS 54 determines that it should initialize into the "offline at start-up" mode, then at 86 the TAP controllers 72, 76 of the adapter 70 and STL 74, respectively are coupled together and coupled, through the adapter 70, to the DTS's adapter 64. At 88, the TS's adapter 70 holds the TMS signal at a logic '1" for five or more TCK cycles which forces the states of the TAPC's 72 and 76 to the test logic reset (TLR) state (FIG. 4). At 90, TMS is then forced to a logic "0" for one or more clocks which forces the states of the TAPC's 72 and 76 to the run test idle (RTI) state. At 92, the TAPC 76 of the STL 74 is then decoupled (e.g., its clock ceases). With the TAPC 76 of the STL decoupled the TAPC 70 of the adapter monitors the shared bus 56 for a synchronization point sequence.

Figure 6:
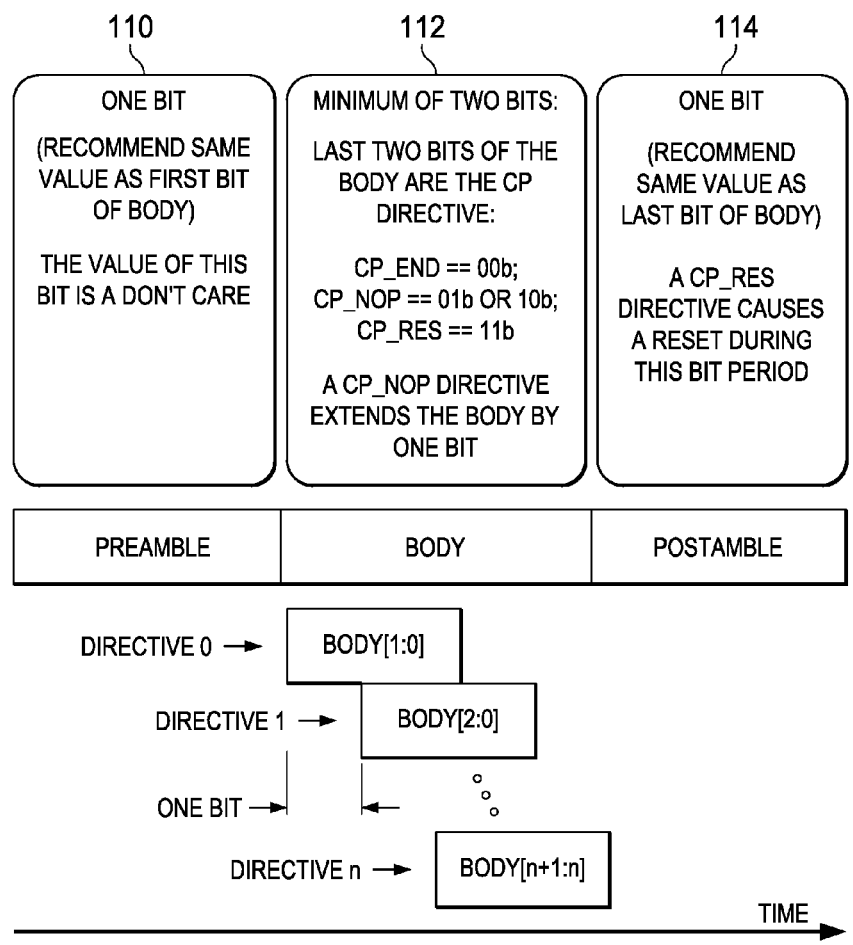
FIG. 6 illustrates the format of a change packet (CP) in accordance with various embodiments.

In accordance with at least some embodiments, the synchronization point sequence is embedded within a JTAG change packet (CP) message and comprises, in part, a 28-series of alternating 1's and 0's. A CP can be used to change the state of a TS (e.g., a TAPC within the TS). In accordance with the preferred embodiments, the CP is also used to encode a synchronization point sequence. FIG. 6 illustrates a CP. The CP shown in FIG. 6 includes a one-bit preamble 110, a multi-bit body 112, and a one-bit postamble 114. The body 112 contains at least two bits and one or more of three different kinds of directives—CP_END, CP_NOP, and CP_RES. The CP_END directive is encoded as a 00b value and determines the operating state once the CP ends. The CP_RES directive is encoded as a 11b value and causes a rest of the TAPC (e.g., TAPC 76) coincident with the CP's postamble bit. The CP_NOP directive is encoded as either 01b or 10b as generally causes no action to occur in and of itself. The bits of a CP_NOP directive of opposite logic level (i.e., 0 followed by a 1, or a 1 followed by 0). The preferred embodiments of the invention uses the characteristic of the CP_NOP directive to cause a concatenated series of 14 CP_NOP directives to be placed in the body 112 of the CP to create the 28-bit series of alternating 1's and 0's. The 28-bit pattern of alternating 1's and 0's is used because it is highly unlikely to otherwise ever occur during normal operation or during a hot connect/disconnect event. Other bit patterns can be used as well.

Figure 7:
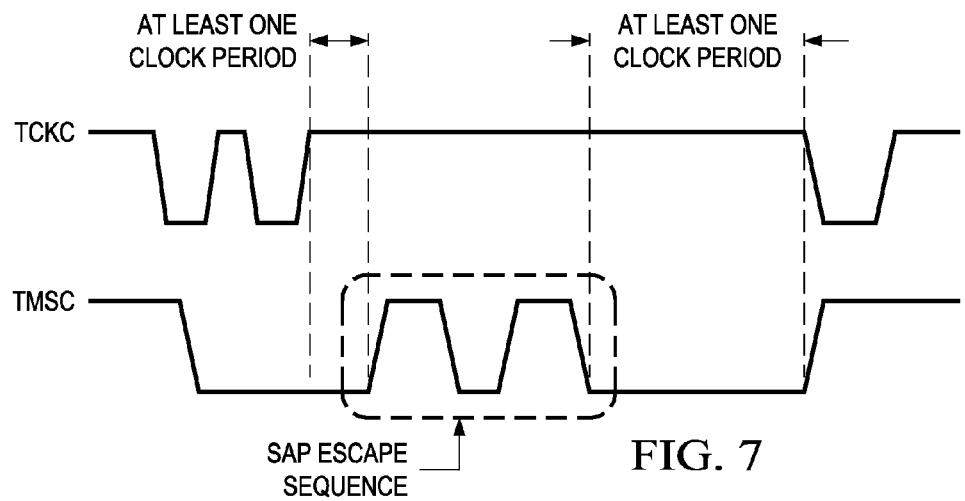
FIG. 7 illustrates a preferred embodiment of an escape sequence that forms part of a synchronization point sequence included within a change packet (CP)

Following the 28-bit pattern of alternating 1's and 0's, the synchronization point sequence also includes a start advanced protocol (SAP) escape sequence. As shown in FIG. 7 and in accordance with the preferred embodiments, the SAP escape sequence comprises 4 or 5 edges of the JTAG TMSC signal while the clock (TCK) is held a logic high state. The first TMSC edge associated with the SAP escape sequence should be separated from the preceding TCKC falling edge and other TMSC edges by a minimum of one TCKC period. The last TMSC edge associated with the SAP escape sequence should preceded the next TCKC falling edge by at least one TCKC period. The TAPC 72 is thus capable of detecting the SAP escape sequence when the TCKC signal is a logic "1."

Figure 8:
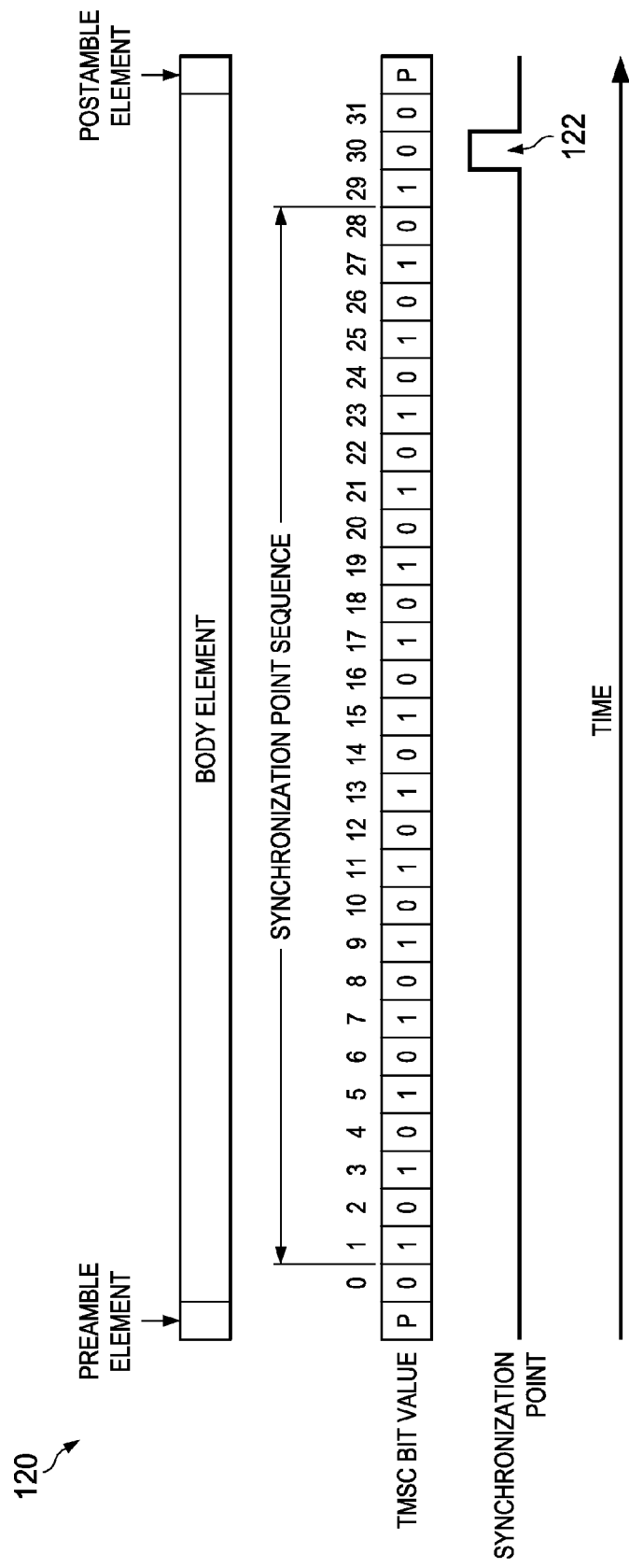
FIG. 8 shows a CP containing the synchronization point sequence.

FIG. 8 illustrates a complete synchronization point sequence in a CP 120 comprising a 28-bit pattern of alternating 1's and 0's followed by an SAP escape sequence. The SAP escape sequence is implemented using the CP_END directive. The detection of the synchronization point sequence is shown at 122.

Referring again to FIG. 5 and continuing at 94, the TAPC 70 of the adapter detects the occurrence of a 28-bit pattern of alternating 1's and 0's. Once such a pattern has been detected then, at 96, the TAPC 70 of the adapter detects the occurrence of the subsequent SAP escape sequence. If no subsequent SAP escape sequence is detected then, the TAPC 70 of the adapter begins anew in looking for a 28-bit pattern of alternating 1's and 0's. Once the SAP escape sequence is detected, the TAPC 70 determines that it is receiving a CP. At 98 the STL is coupled and the predetermined (e.g., mandatory) feature set is implemented. At this point, the TAPC 70, now armed with the knowledge that it is receiving a CP, waits for the end of the CP (100). Once a synchronization point sequence has been detected and processed, all TS's 54 within the system then restart their capability of detecting future synchronization point sequences. In some embodiments, the DTS 52 periodically (e.g., once per minute, per hour, etc.) issues a CP containing a synchronization point sequence to recruit any possible powered on but offline TS's to go online and participate in the system.

A properly qualified synchronization point (e.g., one with 28 alternating 1's and 0's followed by an SAP escape sequence within a CP) places a TAPC online in a state where it is processing CP directives before a CP_END or CP_RES directive terminates the CP. Because this is also the state of TAPCs that are already online, this aspect of TAP controller operation is harmonized.

Figure 9:
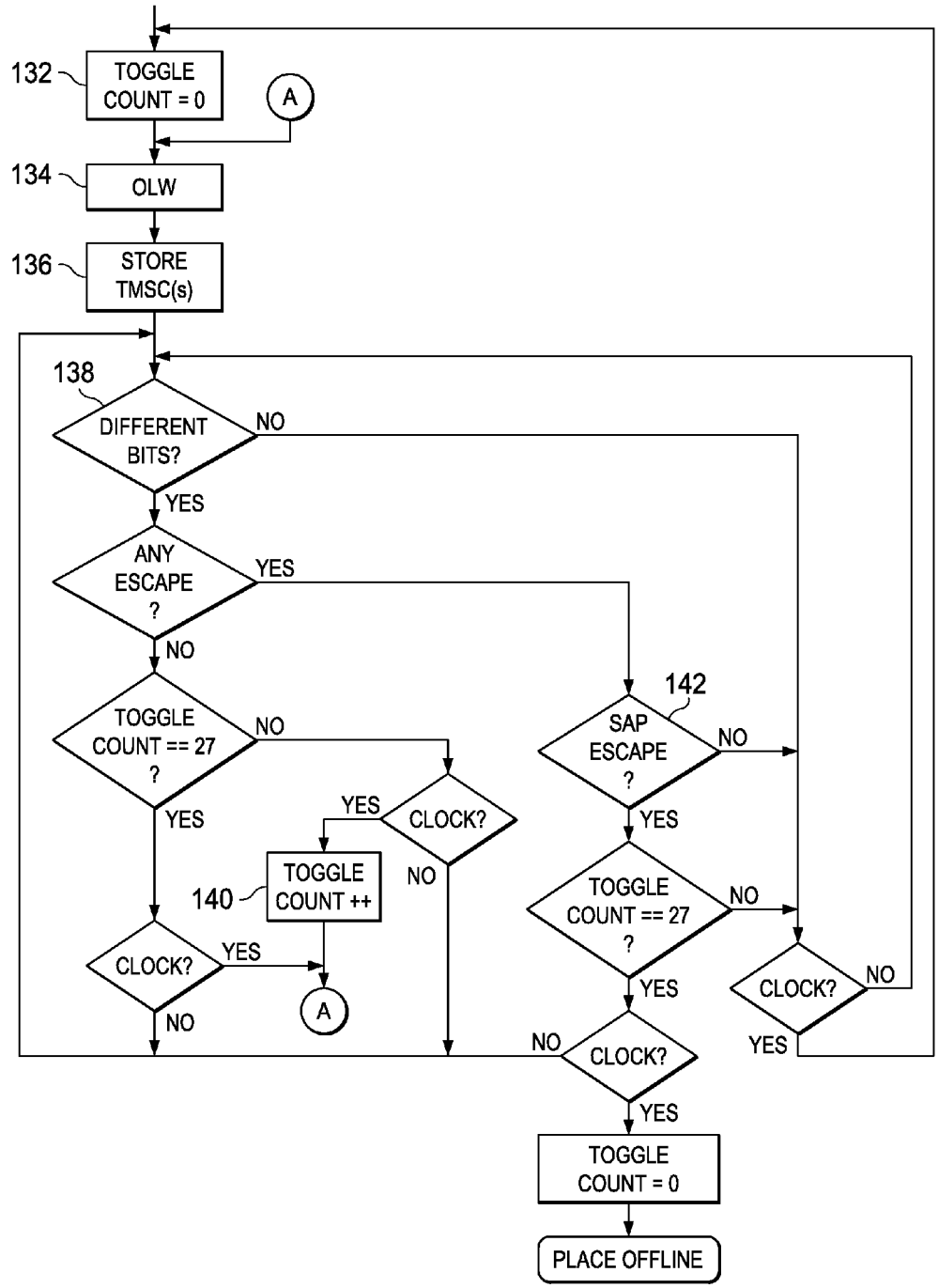
FIG. 9 shows a preferred method by which a device detects the presence of a synchronization point sequence.

FIG. 9 shows a flow chart 130 depicting how a TAPC 70 in a TS 54 can detect the synchronization sequence point. At 132, a TOGGLE COUNT value is set to 0 and the TS then transitions to an OLW (Off-line waiting) state at 134 (waiting for a synchronization point sequence). At 136, the TAPC 70 stores any received TMSC bits and determines at 138 whether the logic level of each bit is different than the level of an immediately preceding bit. At 140, the TOGGLE COUNT is incremented. If the TOGGLE COUNT reaches 27 (indicating the end of the 28-bit pattern of alternating 1's and 0's), the TAPC 70 determines at 142 whether the SAP escape sequence is present. All of the "Clock" decision points in FIG. 9 determine whether a falling edge of the TCKC is detected.

Figure 10:
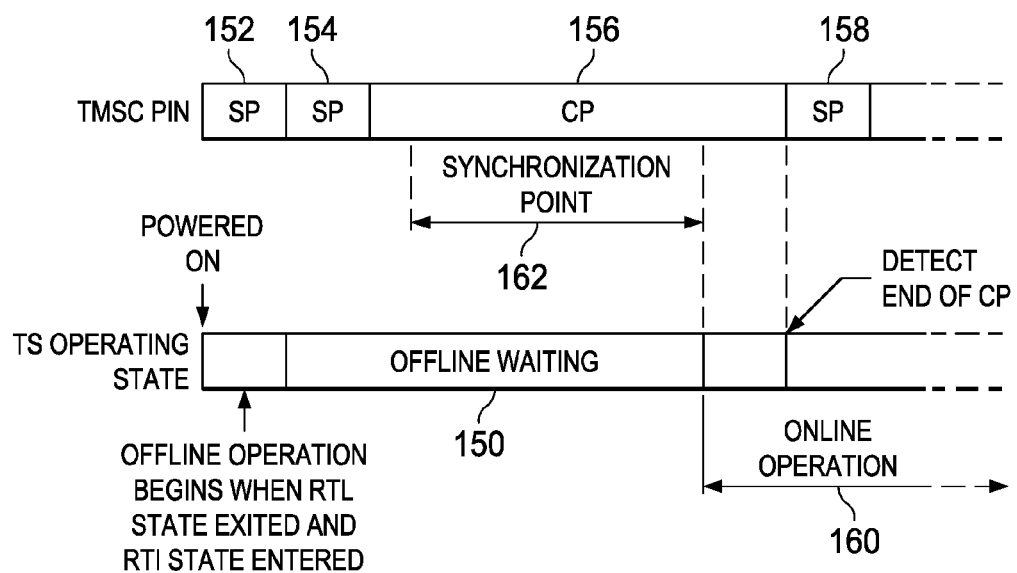
FIG. 10 illustrates the operational state of an off-line device upon detecting a synchronization point sequence.

FIG. 10 illustrates the operational state of an off-line device upon detecting a synchronization point sequence. The bits on the TMSC pin provide for two scan packets (SP's) 152 and 156, followed by a CP 156, and then another SP 158. CP 156 has encoded its body a synchronization point sequence as indicated at 162. Meanwhile, the operating state of the TAPC 70 of the TS 54, which has just been powered up, is off-line waiting (i.e., waiting for a synchronization point sequence). The TAPC 70 does not know the state of the system and does not recognize the SPs 152, 154, nor the beginning of the CP 156. Once, however, the TAPC 70 detects the presence of the synchronization point sequence, then the TAPC 70 knows that is receiving a CP 156 and transitions to online operation (160) and waits for the end of the CP, which it is now capable of detecting.

Each TS 54 has a unique value (e.g., an address) that is used by the DTS 52 to communicate with each such TS 54. Upon a TS 54 being powered up, its address defaults to a value of 0. Multiple TS's 54 may power up at the same time and all such newly powered devices will have the same address of 0. Two or more TS's 54 with the same address cause a conflict for the DTS—each TS should have a unique address. Thus, in accordance with preferred embodiments of the invention, an address selection process occurs as part of the DTS 52 sending out synchronization point sequences.

The DTS 52 should not use an address of 0 to communicate with any TS's as two or more TS's may have that same default address at the same time. Instead, the DTS 52 issues a command that causes address assignments to be made to any TS's 54 that have the default address. This command to initiate address assignment may be issued automatically after issuing a CP containing a synchronization point sequence. The DTS issues such a command not knowing whether there are nay TS's with the default address. If there are no TS's with a default address, then no TS's respond to the DTS's address assignment attempt. If, however, one or more TS's exist that currently have the default address, then those TS's participate in the address assignment process. The address assignment process can be any desired arbitration or other type of assignment process. For example, based on one or more criteria, one of the TS's win a round of arbitration among the various TS's having the default address to be re-assigned. The winning TS 54 is provided with or selects a new unique address not already assigned to another TS in the system. The DTS 52 is informed of this event and again initiates a new round of arbitration and address assignment. If there is still at least one TS with the default address, one of such TS's again wins the arbitration process and receives a new unique address. This process continues until no TS responds to the DTS's attempt to perform an address assignment.

The address is a value that is unique to the targeted TAP controller. That value can be a TAP Controller Address (TCA) or a Controller Identifier (CID). A TCA preferably is a 35-bit value comprising a 27-bit IDCODE concatenated with an 8-bit node identification number (NODE ID). Per the IEEE 1149 specification, the 27-bit IDCODE comprises a 16-bit part number and an 11-bit manufacturer identifier. The 8-bit NODE ID provides for 256 uniquely addressable TAP controllers with identical IDCODE elements. The NODE_ID is created at the chip level using any one of several methods or a mix of the following methods: from external pins whose value is latched when chip hard reset is released, fusible elements, programmable elements such as electrically-erasable programmable read-only memories (EEPROMs), a register loaded by the application, and fixed (hardwired). The TCA is generated and provided to the associated TAP controller.

In alternative embodiments, since TCAs are 35 bits in length and at least some systems will have 16 or fewer TAP controllers, a performance improvement can be attained by allocating a four-bit alias for up to 16 TCAs. This alias is called a Controller ID (CID).

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A circuit device comprising:
   A. a test data in lead, a test data out lead, a test clock lead carrying test clock signals, and a test mode select lead;
   B. adapter circuitry that includes a first test access port controller coupled with the test clock lead and the test mode select lead, the firsts test access port controller having the states of Test Logic Reset, Run Test/Idle, Select-DR Scan, and Select-IR Scan;
   C. test logic circuitry that includes a second test access port controller coupled with the test clock lead and the test mode select lead, the second test access port controller having the states of Test Logic Reset, Run Test/Idle, Select-DR Scan, and Select-IR Scan;
   D. the adapter circuitry including power up circuitry that can:
      i. hold the test mode select lead at a high logic level for at least five cycles of the test clock signals to force the first and second test access port controllers to the Test Logic Reset state,
      ii. then hold the test mode select lead at a low logic level for one or more cycles of the test clock signals to force the first and second test access port controllers to the Run Test/Idle state, and
      iii. then decouple the second test access port controller from the test clock lead while maintaining the first test access port controller coupled with the test clock lead.

2. The device of claim 1 in which the power up circuitry operates at a change of low power to high power in the circuit device.

3. The device of claim 1 in which the power up circuitry operates at a change of low power to high power in the device to first couple the test clock lead to the first and second test access port controllers.

4. The device of claim 1 in which the circuit device includes core logic coupled to the test logic circuitry and input/output logic coupled to at least one lead of the test data in lead, the test data out lead, the test clock lead, and the test mode select lead.

* * * * *